(12) United States Patent
Hirano et al.

(10) Patent No.: US 10,546,725 B2
(45) Date of Patent: Jan. 28, 2020

(54) PLASMA PROCESSING APPARATUS

(71) Applicant: TOKYO ELECTRON LIMITED, Tokyo (JP)

(72) Inventors: Takahiro Hirano, Yamanashi (JP); Toshihiko Iwao, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 334 days.

(21) Appl. No.: 15/429,393

(22) Filed: Feb. 10, 2017

(65) Prior Publication Data

US 2017/0236690 A1 Aug. 17, 2017

(30) Foreign Application Priority Data

Feb. 17, 2016 (JP) .................................. 2016-028359

(51) Int. Cl.
*H01J 37/32* (2006.01)
*C23C 16/455* (2006.01)
*C23C 16/511* (2006.01)
*H01L 21/67* (2006.01)
*H01L 21/683* (2006.01)

(52) U.S. Cl.
CPC .. *H01J 37/32192* (2013.01); *C23C 16/45544* (2013.01); *C23C 16/511* (2013.01); *H01L 21/67069* (2013.01); *H01J 2237/334* (2013.01); *H01J 2237/3321* (2013.01); *H01L 21/6831* (2013.01)

(58) Field of Classification Search
USPC ............................ 156/345.41; 118/723 MW
See application file for complete search history.

(56) References Cited

U.S. PATENT DOCUMENTS

| | | | | |
|---|---|---|---|---|
| 5,911,852 A | * | 6/1999 | Katayama | H01J 37/32192 118/723 ME |
| 2004/0206729 A1 | * | 10/2004 | Shinohara | H01J 37/32192 219/121.43 |
| 2005/0172901 A1 | * | 8/2005 | Ishibashi | H01J 37/32192 118/723 I |
| 2008/0060759 A1 | * | 3/2008 | Chen | H01J 37/32192 156/345.41 |

FOREIGN PATENT DOCUMENTS

| | | |
|---|---|---|
| JP | 2000-273646 A | 10/2000 |
| JP | 2004-014262 A | 1/2004 |
| JP | 2015-188061 A | 10/2015 |

* cited by examiner

*Primary Examiner* — Rakesh K Dhingra
(74) *Attorney, Agent, or Firm* — Rothwell, Figg, Ernst & Manbeck, P.C.

(57) ABSTRACT

Disclosed is a plasma processing apparatus including: a processing container that defines a processing space; a microwave generator that generates microwaves for plasma excitation; a dielectric having a facing surface that faces the processing space; a slot plate provided on a surface of the dielectric opposite to the facing surface and formed with a plurality of slots that radiate the microwaves to the processing space through the dielectric; and a conductor pattern that is provided on the facing surface of the dielectric and converges an electric field corresponding to the microwaves radiated from each of the slots.

9 Claims, 5 Drawing Sheets

PLASMA PROCESSING APPARATUS

CROSS-REFERENCE TO RELATED APPLICATIONS

This application is based on and claims priority from Japanese Patent Application No. 2016-028359 filed on Feb. 17, 2016 with the Japan Patent Office, the disclosure of which is incorporated herein in its entirety by reference.

TECHNICAL FIELD

Various aspects and exemplary embodiments of the present disclosure relate to a plasma processing apparatus.

BACKGROUND

In a semiconductor manufacturing process, a plasma processing apparatus has been widely used to perform a plasma processing for the purpose of deposition or etching of a thin film. Examples of the plasma processing apparatus include a plasma chemical vapor deposition (CVD) apparatus for performing a thin film deposition processing and a plasma etching apparatus for performing an etching processing.

In a recent plasma processing, a plasma processing apparatus using excitation of a processing gas by microwaves has been used in some cases. In the plasma processing apparatus, microwaves for plasma excitation generated by a microwave generator are radiated by using a slot plate having a plurality of slots formed therein. Further, in the plasma processing apparatus, the microwaves for plasma excitation radiated from the plurality of slots are introduced into a plasma processing space by a dielectric provided between the slot plate and the plasma processing space.

Incidentally, in such a plasma processing apparatus, it is effective to increase an electric field on the surface of the dielectric on the plasma processing space side in order to efficiently generate plasma. In this regard, a technique has been proposed in which a recessed portion recessed in a tapered shape is provided on the surface of the dielectric on the plasma processing space side, and an electric field corresponding to microwaves is converged by the recessed portion. See, for example, Japanese Patent Laid-Open Publication No. 2015-188061.

SUMMARY

According to an aspect, the present disclosure provides a plasma processing apparatus including: a processing container that defines a processing space; a microwave generator that generates microwaves for plasma excitation; a dielectric having a facing surface that faces the processing space; a slot plate provided on a surface of the dielectric opposite to the facing surface and formed with a plurality of slots that radiate the microwaves to the processing space through the dielectric; and a conductor pattern that is provided on the facing surface of the dielectric and converges an electric field corresponding to the microwaves radiated from each of the slots.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
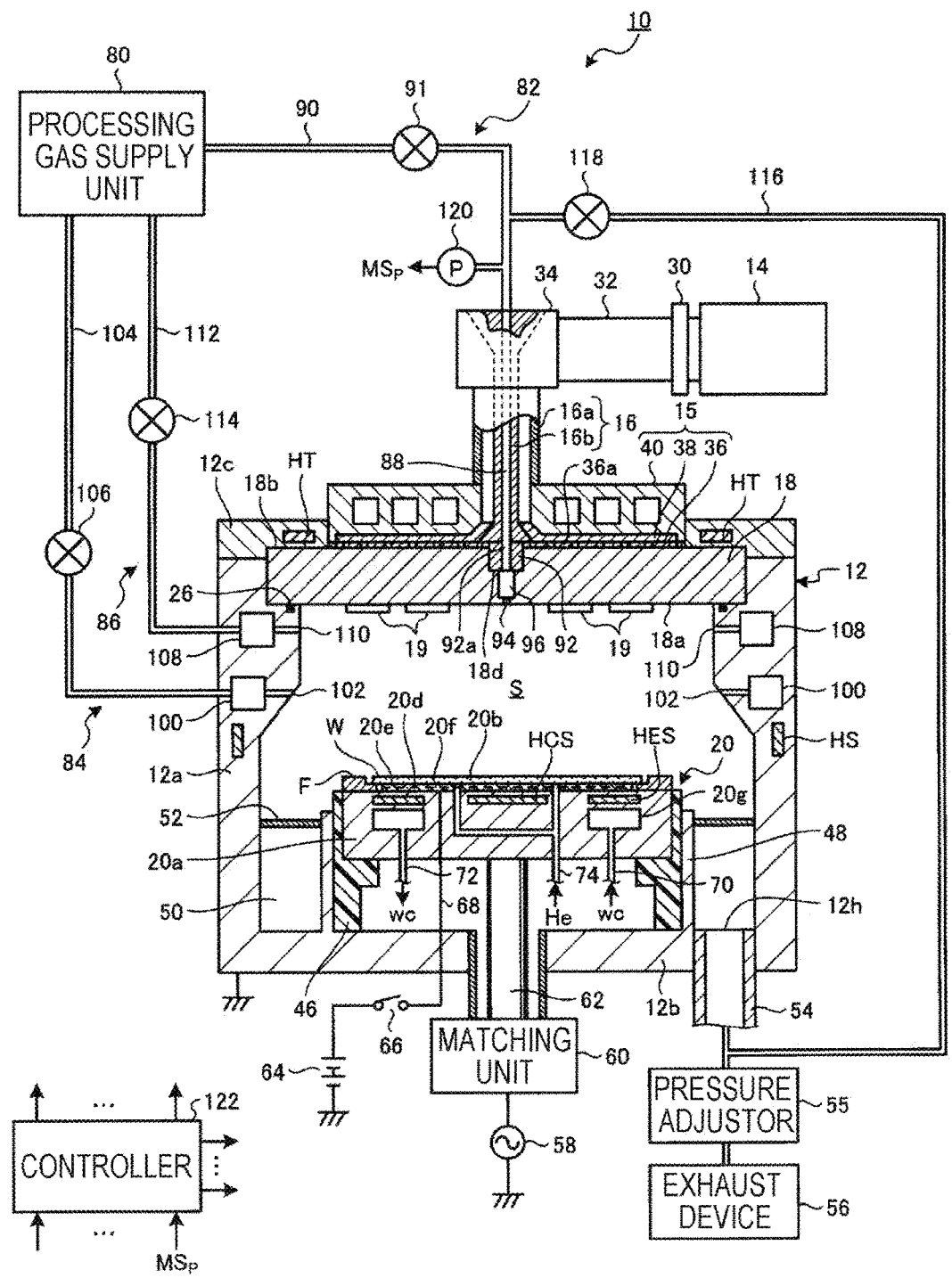
FIG. 1 is a view illustrating a schematic configuration of a plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described conventional technique, the electric field on the surface of the dielectric may be increased. However, since the thickness of the recessed portion provided on the surface of the dielectric on the plasma processing space side is smaller than the thickness of the other portions, the strength of the dielectric may be decreased. The decrease in strength of the dielectric may undesirably cause breakage of the dielectric. Therefore, it has been required to increase the electric field on the surface of the dielectric while maintaining the strength of the dielectric.

According to an aspect, the present disclosure provides a plasma processing apparatus including: a processing container that defines a processing space; a microwave generator that generates microwaves for plasma excitation; a dielectric having a facing surface that faces the processing space; a slot plate provided on a surface of the dielectric opposite to the facing surface and formed with a plurality of slots that radiate the microwaves to the processing space through the dielectric; and a conductor pattern that is provided on the facing surface of the dielectric and converges an electric field corresponding to the microwaves radiated from each of the slots.

In the above-described plasma processing apparatus, the conductor pattern is provided in at least one region among a plurality of regions that overlap with the plurality of slots, respectively, when viewed from a direction perpendicular to the facing surface, on the facing surface of the dielectric.

In the above-described plasma processing apparatus, at least a part of the conductor pattern is formed in a rectangular shape, and when a wavelength of the microwaves propagated inside the dielectric is λ, a length of the at least a part of the conductor pattern is within a range of 3λ/8 to 5λ/8.

In the above-described plasma processing apparatus, the length of the at least a part of the conductor pattern is a length that resonates with the microwaves.

In the above-described plasma processing apparatus, the length of the at least a part of the conductor pattern is λ/2.

In the above-described plasma processing apparatus, a protective film is formed on the conductor pattern to protect the conductor pattern from plasma.

According to an aspect of the plasma processing apparatus of the present disclosure, it is possible to increase the electric field on the surface of the dielectric while maintaining the strength of the dielectric.

Hereinafter, exemplary embodiments of the plasma processing apparatus disclosed herein will be described in detail with reference to the drawings. Meanwhile, in the respective drawings, the same or corresponding parts will be denoted by the same symbols.

FIG. 1 is a view illustrating a schematic configuration of a plasma processing apparatus according to an exemplary embodiment. The plasma processing apparatus 10 illustrated in FIG. 1 is an apparatus that performs a plasma processing such as, for example, plasma CVD, plasma ALD, or plasma etching under surface wave plasma excited using microwaves and a plate slot antenna. The plasma processing apparatus 10 includes a chamber (processing container) 12, a microwave generator 14, an antenna 15, a dielectric window 18, and a stage 20. The plasma processing apparatus 10 further includes heaters HT, HS, HCS, and HES as temperature control mechanisms.

The chamber 12 accommodates a workpiece (e.g., semiconductor wafer) W, and defines a processing space S where plasma is generated. The chamber 12 is made of a metal such as, for example, aluminum or stainless steel. The chamber 12 is grounded. The chamber 12 includes a sidewall 12a, a bottom 12b, and a ceiling 12c. The sidewall 12a is formed in a substantially cylindrical shape. The bottom 12b is provided at a lower end side of the sidewall 12a. The bottom portion 12b includes an exhaust hole 12h for exhaust formed therein. The upper end portion of the sidewall 12a is opened. The upper end opening of the sidewall 12a is closed by a dielectric window 18. The dielectric window 18 is interposed between the upper end portion of the sidewall 12a and the ceiling 12c. The dielectric window 18 has a facing surface 18a that faces the processing space S. A sealing member 26 may be interposed between the dielectric window 18 and the upper end portion of the sidewall 12a. The sealing member 26 is, for example, an O-ring, and contributes to sealing of the chamber 12.

The stage 20 is provided below the dielectric window 18. The stage 20 includes a susceptor (placing table) 20a and an electrostatic chuck 12b.

The susceptor 20a is supported by a cylindrical support 46. The cylindrical support 46 is made of an insulating material, and extends vertically upwardly from the bottom 12b. Further, a cylindrical conductive support 48 is provided on the outer periphery of the cylindrical support 46. The cylindrical support 48 extends vertically upwardly from the bottom 12b of the chamber 12 along the outer periphery of the cylindrical support 46. An annular exhaust path 50 is formed between the cylindrical support 48 and the sidewall 12a.

An annular baffle plate 52 formed with a plurality of through-holes is attached to the upper portion of the exhaust path 50. The exhaust path 50 is connected to an exhaust pipe 54 that provides one or a plurality of exhaust holes 12h. The exhaust pipe 54 is connected with an exhaust device 56 via a pressure adjustor 55. The exhaust device 56 includes a vacuum pump such as, for example, a turbo molecular pump. The pressure adjustor 55 adjusts an exhaust amount of the exhaust device 56 to adjust the pressure in the chamber 12. The processing space S in the chamber 12 may be decompressed to a desired vacuum degree by the pressure adjustor 55 and the exhaust device 56. Further, the exhaust device 56 may be operated such that a gas is exhausted from the periphery of the stage 20 to the exhaust device 56 through the exhaust path 50.

The susceptor 20a is made of a conductor such as, for example, aluminum, and also serves as a high frequency electrode. The susceptor 20a is electrically connected with a high frequency power source 58 for RF bias via a matching unit 60 and a power feeding rod 62. The high frequency power source 58 outputs high frequency waves of a constant frequency suitable for controlling the energy of the ions incident on the workpiece W, for example, 13.65 MHz at a predetermined power. The matching unit 60 accommodates a matcher for matching between the impedance of the high-frequency power source 58 side and the impedance of the load side including, mainly, the plasma and the high frequency electrode (susceptor) in the processing container 12.

The electrostatic chuck 12b is provided on the upper surface of the susceptor 20a. The upper surface of the electrostatic chuck 12b constitutes a placing region for placing the workpiece W. The electrostatic chuck 12b holds the workpiece W by an electrostatic attraction force. A focus ring F is provided radially outside the electrostatic chuck 12b to annularly surround the periphery of the workpiece W. The electrostatic chuck 12b includes an electrode 20d, an insulating film 20e, and an insulating film 20f. The electrode 20d is formed of a conductive film, and provided between the insulating film 20e and the insulating film 20f. The electrode 20d is electrically connected with a high-voltage DC power source 64 via a switch 66 and a coated wire 68. The electrostatic chuck 12b may attract and hold the workpiece W by an electrostatic force generated by the DC voltage applied from the DC poser source 64.

A circumferentially extending annular coolant chamber 12g is provided inside the susceptor 20a. In the coolant chamber 12g, a coolant of a predetermined temperature, for example, cooling water wc is circularly supplied from a chiller unit (not illustrated) through pipes 70, 72. The processing temperature of the workpiece W on the electrostatic chuck 12b may be controlled by the temperature of the coolant wc. Further, a heat transfer gas (e.g., He gas) from a heat transfer gas supply unit (not illustrated) is supplied between the upper surface of the electrostatic chuck 12b and the rear surface of the workpiece W through a gas supply pipe 74.

The heater HT is provided in the ceiling 12c, and extends annularly to surround an antenna 15. The heater HS is provided inside the sidewall 12a at a height position between the dielectric window 18 and the stage 20, and extends annularly. The heater HCS is provided inside the susceptor 20a, and faces the central portion of the workpiece W. The heater HES is provided annularly inside the susceptor 20a to surround the heater HCS, and faces the peripheral portion of the workpiece W.

The microwave generator 14 outputs microwaves having a frequency of, for example, 2.45 GHz at a predetermined power. Further, the plasma processing apparatus 10 includes a coaxial waveguide 16, a tuner 30, a waveguide 32, and a mode converter 34. The microwave generator 14 is connected to the upper portion of the coaxial waveguide 16 via the tuner 30, the waveguide 32, and the mode converter 34.

The coaxial waveguide 16 includes a cylindrical or tubular outer conductor 16a and an inner conductor 16b, which extend coaxially along the central axis of the chamber 12. The lower end of the outer conductor 16a is electrically connected to the upper portion of the cooling jacket 40 having a conductive surface. The inner conductor 16b is provided inside the outer conductor 16a. The lower end of the inner conductor 16b is connected to a slot plate 36 of the antenna 15 via a connector 92.

The microwaves generated by the microwave generator 14 are guided to the mode converter 34 via the tuner 30 and the waveguide 32. The mode converter 34 converts a mode of the microwaves, and supplies the mode-converted microwaves to the coaxial waveguide 16. The microwaves from the coaxial waveguide 16 are supplied to the antenna 15.

The antenna 15 radiates the microwaves generated by the microwave generator 14. The antenna 15 includes a slot plate 36, a dielectric plate 38, and a cooling jacket 40. The antenna 15 is provided on a surface 18b opposite to the facing surface 18a of the dielectric window 18, and radiates the microwaves generated by the microwave generator 14 to the processing space S through the dielectric window 18.

Figure 2:
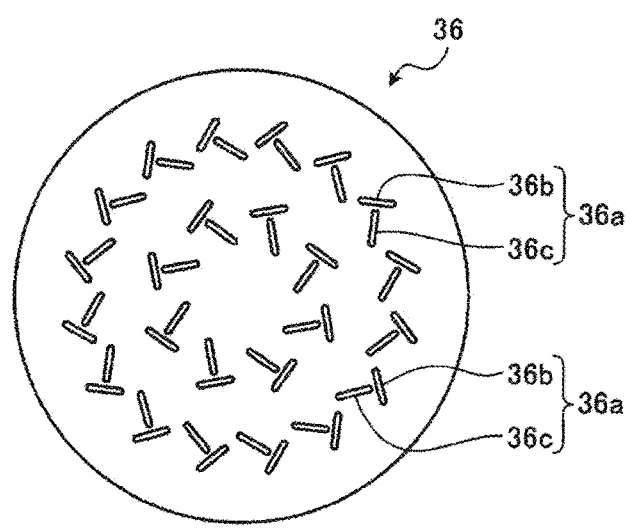
FIG. 2 is a plan view of a slot plate according to an exemplary embodiment.

The slot plate 36 is disposed on the surface 18b opposite to the facing surface 18a of the dielectric window 18 so as to match the plate surface with that of the dielectric window 18. The slot plate 36 is made of a conductive material such as a metal having conductivity, and is formed in a substantially disc shape. As illustrated in FIG. 2, the slot plate 36 is a slot plate constituting a radial line slot antenna. FIG. 2 is a plan view of a slot plate according to an exemplary embodiment. As illustrated in FIG. 2, the slot plate 36 includes a plurality of slots 36a formed therein. Each slot 36a includes slot 36b and 36c, which are elongated holes extending in a direction intersecting with or orthogonal to each other. The plurality of slots 36a are provided radially at a predetermined interval, as well as circumferentially at a predetermined interval.

The dielectric plate 38 shortens the wavelength of the microwaves, and has a substantially disc shape. The dielectric plate 38 is made of, for example, quartz or alumina. The dielectric plate 38 is interposed between the slot plate 36 and the lower surface of the cooling jacket 40. The surface of the cooling jacket 40 has conductivity. The cooling jacket 40 includes a flow path formed therein to allow a coolant to flow therethrough, so that the dielectric plate 38 and the slot plate 36 are cooled by the flow of the coolant. The upper surface of the cooling jacket 40 is electrically connected with the lower end of the outer conductor 16a of the coaxial waveguide 16.

The microwaves from the coaxial waveguide 16 are propagated to the dielectric plate 38, and radiated into the processing space S from the slots 36a of the slot plate 36 through the dielectric window 18. The dielectric window 18 has a substantially disc shape, and is made of a dielectric such as, for example, quartz or alumina. The dielectric window 18 is provided between the antenna 15 and the processing space S. In an exemplary embodiment, the dielectric window 18 is provided just below the antenna 15.

FIG. 1 is referred to again. As illustrated in FIG. 1, a conductor pattern 19 is formed on the facing surface 18a of the dielectric window 18. The conductor pattern 19 converges an electric field corresponding to the microwaves radiated from each slot 36a of the slot plates 36.

Figure 3:
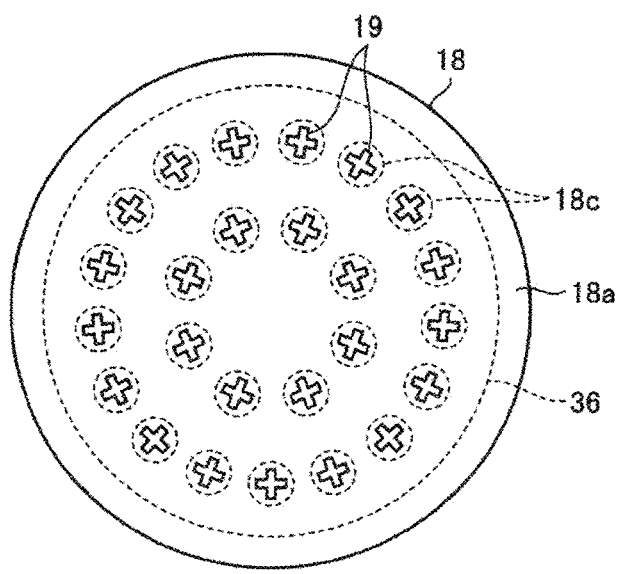
FIG. 3 is a view for explaining an exemplary positional relationship between a conductor pattern and each slot of the slot plate.

Here, a positional relationship between the conductor pattern 19 and each slot 36a of the slot plate 36 will be described. FIG. 3 is a view for explaining an exemplary positional relationship between a conductor pattern and each slot of the slot plate. FIG. 3 is a plan view of the dielectric window 18 when viewed from the facing surface 18a side, which illustrates a state where the slot plate 36 is disposed on the surface 18b opposite to the facing surface 18a of the dielectric window 18.

As illustrated in FIG. 3, a conductor pattern 19 is provided on each of the plurality of regions 18c that overlap with the plurality of slots 36a, respectively, when viewed from a direction perpendicular to the facing surface 18a on the facing surface 18a of the dielectric window 18.

In the example of FIG. 3, the conductor pattern 19 is provided in each of the plurality of regions 18c, but the conductor pattern 19 does not need to be provided in each of the plurality of regions 18c. That is, the conductor pattern 19 may be formed in at least one region 18c among the plurality of regions 18c.

Figure 4:
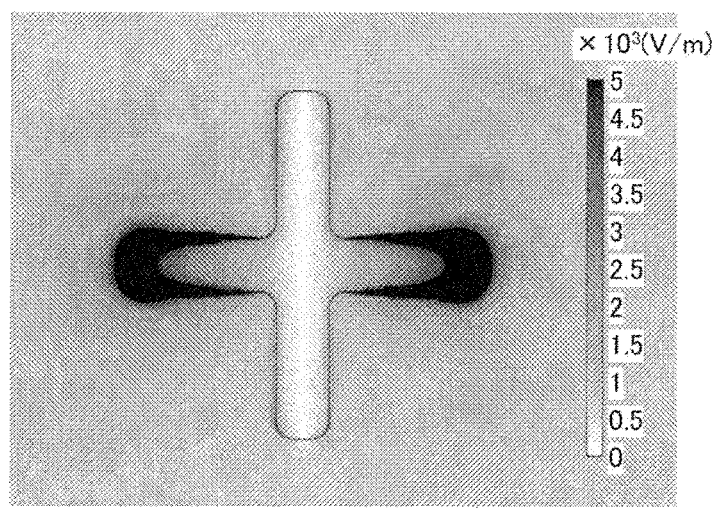
FIG. 4 is a view illustrating an example of a simulation result of an electric field intensity distribution around the conductor pattern illustrated in FIG. 3.

FIG. 4 is a view illustrating an example of a simulation result of an electric field intensity distribution around the conductor pattern illustrated in FIG. 3. In the simulation, it is assumed that microwaves of 1 W are used as microwaves to be input into a single slot 36a.

As is clear from the simulation result of FIG. 4, the electric field strength around the conductor pattern 19 illustrated in FIG. 3 was $5 \times 10^3$ V/m or more, which satisfied a predetermined allowable specification. That is, it has been confirmed that the electric field corresponding to the microwaves radiated from each slot 36a is converged around the conductor pattern 19 by forming the conductor pattern 19 in each of the plurality of regions 18c that overlap with the plurality of slots 36a, respectively, when viewed from the direction perpendicular to the facing surface 18a, on the facing surface 18a of the dielectric window 18.

The electric field corresponding to the microwaves may be converged around the conductor pattern 19 by forming the conductor pattern 19 on the facing surface 18a of the dielectric window 18 as in the exemplary embodiment. Therefore, according to the exemplary embodiment, the electric field of the facing surface 18a of the dielectric window 18 may be increased without forming, for example, a recessed portion on the facing surface 18a of the dielectric window 18. As a result, according to the exemplary embodiment, the electric field on the surface of the dielectric window 18 may be increased while maintaining the strength of the dielectric window 18. Thus, plasma may be efficiently generated.

FIG. 1 is referred to again. The plasma processing apparatus 10 includes a processing gas supply unit 80 that provides all processing gases used in the plasma process performed in the apparatus, and also includes, as gas introduction mechanisms for introducing the processing gases provided from the processing gas supply unit 80, three systems of gas lines, that is, a ceiling gas line (first gas introduction unit) 82 including a gas flow path and a gas injection port provided in the dielectric window 18, and a lower sidewall gas line (second gas introduction unit) 84 and an upper sidewall gas line (third gas introduction unit) 86 each including a gas flow path and a gas injection port provided in the sidewall 12a of the chamber 12 at a different height position.

The ceiling gas line 82 includes a hollow gas flow path 88 provided inside the inner conductor 16b of the coaxial waveguide 16 to pass therethrough in an axis direction. A first gas supply pipe 90 from the processing gas supply unit 80 is connected to the upper end of the inner conductor 16b, so that the first gas supply pipe 90 is in communication with the gas flow path 88 of the coaxial waveguide 16. An electromagnetic valve (opening/closing valve) 91 is provided in the first gas supply pipe 90.

The connector 92 is connected to the lower end of the inner conductor 16b. The connector 92 is made of a conductor, for example, copper, aluminum, stainless steel, or an alloy thereof, and is accommodated in a cylindrical recess 18b formed on the upper surface of the dielectric window 18. The central portion of the connector 92 is formed with a through-hole or a gas flow path 92a in communication with the gas flow path 88 of the coaxial waveguide 16.

The central portion of the lower surface (i.e., the facing surface 18a) of the dielectric window 18 is formed with one or a plurality of ceiling gas injection ports 94 facing the processing space S in the chamber 12. Further, the central portion of the dielectric window 18 is formed with a gas flow path leading from the bottom surface of the recess 18b on the upper surface thereof, that is, the lower end of the gas flow path 92a of the connector 92 to the ceiling gas injection port 94 (i.e., a dielectric window gas flow path 96). The dielectric window gas flow path 96 and the ceiling gas injection port 94 constitute an injector.

The processing gas sent from the processing gas supply unit 80 to the ceiling gas line 82 sequentially flows through the first gas supply pipe 90, the gas flow path 88 of the coaxial waveguide 16, the gas flow path 92a of the connector 92, and the dielectric gas flow path 96, and is injected downward from the ceiling gas injection port 94 at the terminal end toward the central portion of the stage 20.

The lower sidewall gas line 84 includes a lower buffer chamber (manifold) 100 formed annularly inside the sidewall 12a of the chamber 12 at a height position in the middle of the dielectric window 18 and the stage 20, a plurality of (e.g., twenty four (24)) lower sidewall gas injection ports 102 facing the processing space S circumferentially equidistantly from the buffer chamber 100, and a second gas supply pipe 104 extending from the processing gas supply unit 80 to the lower buffer chamber 100. An electromagnetic valve (opening/closing valve) 106 is provided in the second gas supply pipe 104.

The processing gas sent from the processing gas supply unit 80 to the lower sidewall gas line 84 sequentially flows through the second gas supply pipe 104 and the lower buffer chamber 100 inside the sidewall 12a, and is injected substantially horizontally, or obliquely downwardly from the lower sidewall gas injection ports 102 at the terminal end toward the peripheral portion of the stage 20.

The upper sidewall gas line 86 includes an upper buffer chamber (manifold) 108 formed annularly inside the sidewall 12a of the chamber 12 at a height position close to the dielectric window 18, a plurality of (e.g., thirty six (36)) upper sidewall gas injection ports 110 facing the processing space S circumferentially equidistantly from the buffer chamber 108, and a third gas supply pipe 112 extending from the processing gas supply unit 80 to the lower buffer chamber 108. An electromagnetic valve (opening/closing valve) 114 is provided in the third gas supply pipe 112.

The processing gas sent from the processing gas supply unit 80 to the upper sidewall gas line 86 sequentially flows through the third gas supply pipe 112 and the upper buffer chamber 108 inside the sidewall 12a, and is injected substantially horizontally from the upper sidewall gas injection ports 110 at the terminal end along the lower surface of the dielectric window 18.

The plasma processing apparatus 10 has a configuration including the gas introduction mechanisms as described above, particularly, the ceiling gas line 82, and also includes a bypass exhaust line 116 that connects the first gas supply pipe 90 of the ceiling gas line 82 and the exhaust units 55, 56. In the illustrated configuration example, the outlet (lower end) of the bypass exhaust line 116 is connected to the exhaust path 50 between the exhaust hole 12h of the chamber 12 and the pressure adjustor 55. However, the outlet of the bypass exhaust line 116 may be connected to the exhaust path between the pressure adjustor 55 and the exhaust device 56. A normal close type electromagnetic valve (opening/closing valve) 118 is provided in the bypass exhaust line 116. Further, a pressure sensor 120 is also provided in the ceiling gas line 82 to measure the pressure at the downstream side of the electromagnetic valve 91, for example, the pressure in the first gas supply pipe 90.

Further, the plasma processing apparatus 10 includes a controller 122 to control respective components of the plasma processing apparatus 10. The controller 122 may be a computer including a control device such as, for example, a central processing unit (CPU), a storage device such as, a memory, and an input/output device. The controller 122 controls respective components of the substrate processing apparatus 10 by the operation of the CPU in accordance with a control program stored in the memory.

The controller 122 controls individual operations of respective parts, for example, the pressure adjustor 55, the exhaust device 56, the high frequency power source 58, the matching unit 60, the switch 66 for the electrostatic chuck 12b, the microwave generator 14, the processing gas supply unit 80, the electromagnetic valves 91, 106, 114 of the gas introduction units 82, 84, 86, the electromagnetic valve 118 of the bypass exhaust line 116, the heaters HT to HE5, the heat transfer gas supply unit, and the chiller unit, and the operations of the entire apparatus. Further, the controller 122 is connected to a touch panel for man-machine interface (not illustrated) and a storage device (not illustrated) that stores data including, for example, various programs or set values defining various operations of the plasma processing apparatus, and is configured to receive output signals from various sensors, especially an output signal (pressure measurement value signal) $MS_p$ from the pressure sensor 120.

In the plasma processing apparatus 10 configured as described above, the processing gas is supplied from the ceiling gas injection ports 94 of the dielectric window 18 into the processing space S through an injector. In addition, the processing gas is supplied from the lower sidewall gas injection ports 102 and the upper sidewall gas injection ports 110 below the ceiling gas injection ports 94. Further, the microwaves are introduced from the antenna 15 into the processing space S through the dielectric window 18. Therefore, plasma is generated in the processing space S.

Figure 5:
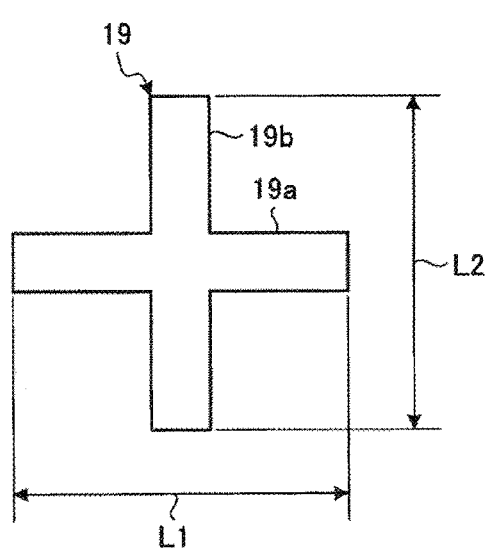
FIG. 5 is an enlarged plan view of a conductor pattern according to an exemplary embodiment.

Next, the shape of the conductor pattern 19 will be described. FIG. 5 is an enlarged plan view of a conductor pattern according to an exemplary embodiment. As illustrated in FIG. 5, the conductor pattern 19 is formed in a cross shape. In other words, a part of the conductor pattern 19 is formed in a rectangular shape. In an exemplary embodiment, the conductor pattern 19 includes a first portion 19a formed in a rectangular shape, and a second portion 19b formed in a rectangular shape and intersecting with the first portion 19a. In an exemplary embodiment, a length L1 of the first portion 19a and a length L2 of the second portion 19b are equal.

Figure 6:
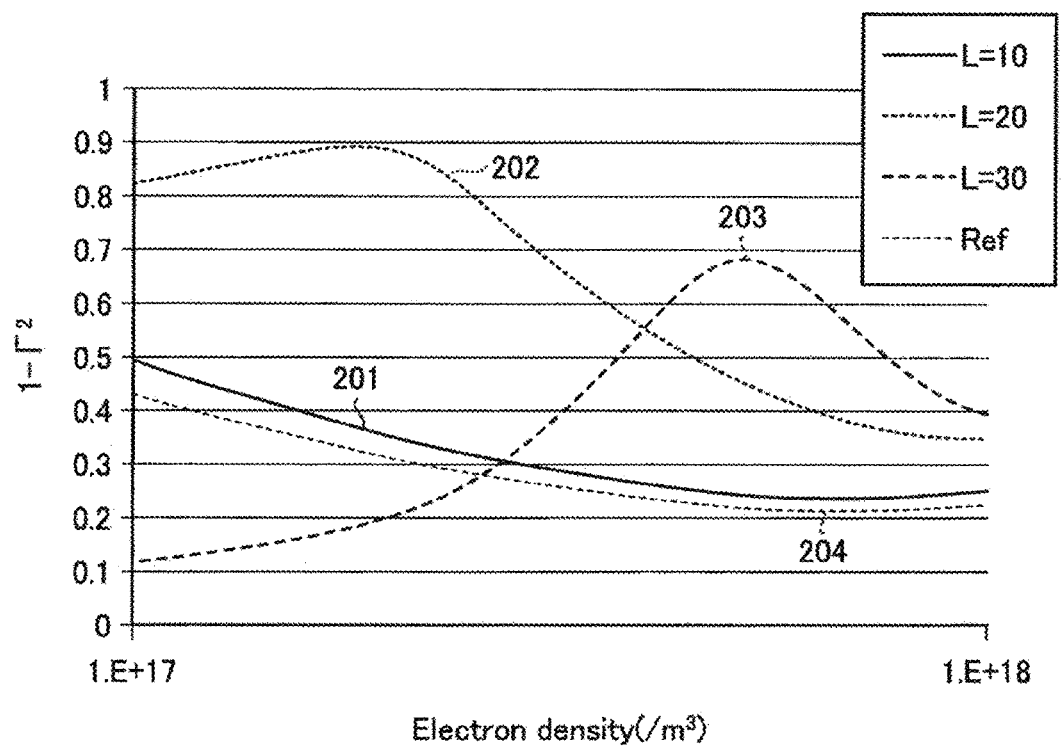
FIG. 6 is a view illustrating an example of a simulation result of a relationship among a length of each portion of the conductor pattern, an electron density of plasma, and an absorption efficiency of microwaves with respect to the plasma.

Here, a preferable range of the length of each portion of the conductor pattern 19 will be described. FIG. 6 is a view illustrating an example of a simulation result of a relationship among a length of each portion of the conductor pattern, an electron density of plasma, and an absorption efficiency of microwaves with respect to the plasma. In FIG. 6, the horizontal axis represents an electron density (/m$^3$) of the plasma generated in the processing space S. Further, the vertical axis represents $1-\Gamma^2$ ($\Gamma$: reflection coefficient of microwaves=reflected wave voltage/traveling wave voltage). In FIG. 6, $1-\Gamma^2$ is an absorption efficiency of the microwave with respect to the plasma, and indicates that the higher the value of $1-\Gamma^2$, the greater the power of the microwaves absorbed by the plasma.

Further, in FIG. 6, a graph 201 is a graph indicating an absorption efficiency of the microwaves when the length of the first portion 19a and the length of the second portion 19b of the conductor pattern 19 are both 10 mm. In addition, a graph 202 is a graph indicating an absorption efficiency of the microwaves when the length of the first portion 19a and the length of the second portion 19b of the conductor pattern 19 are both 20 mm. In addition, a graph 203 is a graph indicating an absorption efficiency of the microwaves when the length of the first portion 19a and the length of the second portion 19b of the conductor pattern 19 are both 30 mm. Further, a graph 204 is a graph indicating an absorption efficiency of the microwaves when the conductor pattern 19 does not exist on the facing surface 18a of the dielectric window 18.

Further, it is assumed that the dielectric window 18 in the simulation illustrated in FIG. 6 is made of alumina.

As illustrated in FIG. 6, when the length of the first portion 19a and the length of the second portion 19b of the conductor pattern 19 are both 20 mm, the maximum value of the absorption efficiency of the microwaves is the highest. Thus, the maximum value of the absorption efficiency of the microwaves is decreased by increasing or decreasing the length of the first portion 19a and the length of the second portion 19b of the conductor pattern 19 from 20 mm. As a result of further intensive studies, the inventors have found that when the length of the first portion 19a and the length of the second portion 19b of the conductor pattern 19 are within the range of 15 mm or more and 25 mm or less, the maximum value of the absorption efficiency of the microwaves is maintained within a predetermined allowable specification. Here, in the case where the dielectric window 18 is made of alumina, the wavelength of the microwaves propagated inside the dielectric window 18 is 40 mm. Therefore, the half wavelength of the microwaves propagated inside the dielectric window 18 corresponds to 20 mm. That is, from the simulation result of FIG. 6, it is found that, assuming that the wavelength of the microwaves propagated inside the dielectric window 18 is $\lambda$, when the length of the first portion 19a and the length of the second portion 19b of the conductor pattern 19 are within a range of $3\lambda/8$ or more and $5\lambda/8$ or less, the maximum value of the absorption efficiency of the microwaves is maintained within the predetermined allowable specification. Accordingly, assuming that the wavelength of the microwaves propagated inside the dielectric window 18 is $\lambda$, the length of the first portion 19a and the length of the second portion 19b of the conductor pattern 19 may be within a range of $3\lambda/8$ or more and $5\lambda/8$ or less.

Further, the length of the first portion 19a and the length of the second portion 19b of the conductor pattern 19 may be a length that resonates with the microwaves propagated inside the dielectric window 18. That is, assuming that the wavelength of the microwaves propagated inside the dielectric window 18 is $\lambda$, the length of the first portion 19a and the length of the second portion 19b of the conductor pattern 19 may be $\lambda/2$. Since the conductor pattern 19 and the microwaves resonate, the electric field converged around the conductor pattern 19 increases. Therefore, the maximum value of the absorption efficiency of the microwaves may be further enhanced.

As described above, according to the plasma processing apparatus 10 of the exemplary embodiment, the electric field corresponding to the microwaves may be converged around the conductor pattern 19 by forming the conductor pattern 19 on the facing surface 18a of the dielectric window 18. Therefore, according to the exemplary embodiment, the electric field of the facing surface 18a of the dielectric window 18 may be increased without forming, for example, a recessed portion on the facing surface 18a of the dielectric window 18. As a result, according to the exemplary embodiment, the electric field on the surface of the dielectric window 18 may be increased while maintaining the strength of the dielectric window 18. Thus, plasma may be efficiently generated.

In the above exemplary embodiment, a part of the conductor pattern 19 is formed in a rectangular shape, but the shape of the conductor pattern 19 is not limited thereto. Hereinafter, modifications of the conductor pattern 19 will be described.

Figure 7:
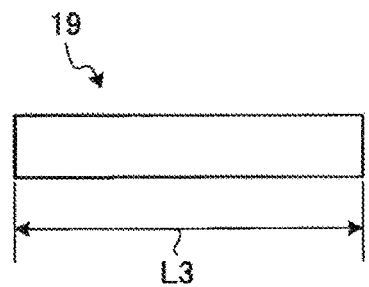
FIG. 7 is an enlarged plan view of a conductor pattern according to Modification 1.

FIG. 7 is an enlarged plan view of a conductor pattern according to Modification 1. For example, as illustrated in FIG. 7, the entire conductor pattern 19 may formed in a rectangular shape. In this case, a length L3 of the conductor pattern 19 may be within a range of $3\lambda/8$ or more and $5\lambda/8$ or less.

Figure 8:
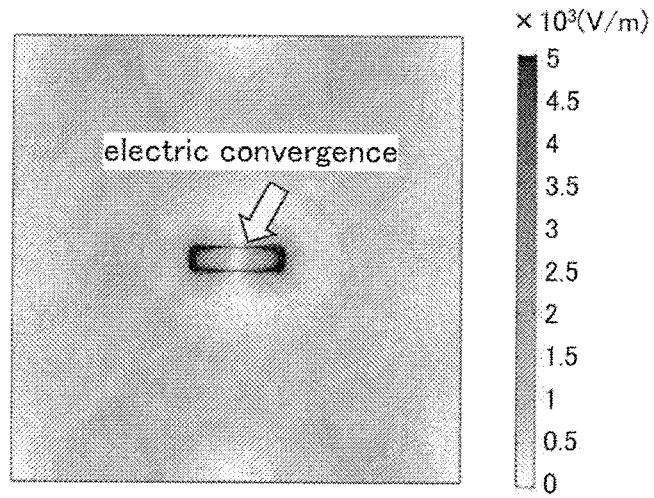
FIG. 8 is a view illustrating an example of a simulation result of an electric field intensity distribution around the conductor pattern illustrated in FIG. 7.

FIG. 8 is a view illustrating an example of a simulation result of an electric field intensity distribution around the conductor pattern illustrated in FIG. 7. As is clear from the simulation result of FIG. 8, the electric field strength around the conductor pattern 19 illustrated in FIG. 7 was $5 \times 10^3$ V/m or more, which satisfied a predetermined allowable specification. That is, even when the entire conductor pattern 19 is formed in a rectangular shape, it has been confirmed that the electric field corresponding to the microwaves is converged around the conductor pattern 19.

Figure 9:
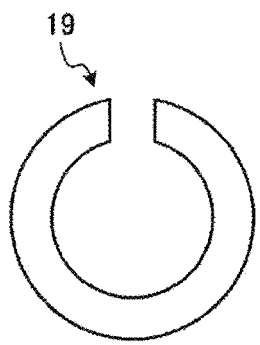
FIG. 9 is an enlarged plan view of a conductor pattern according to Modification 2.

FIG. 9 is an enlarged plan view of a conductor pattern according to Modification 2. For example, as illustrated in FIG. 9, the entire conductor pattern 19 may formed in a C shape.

Figure 10:
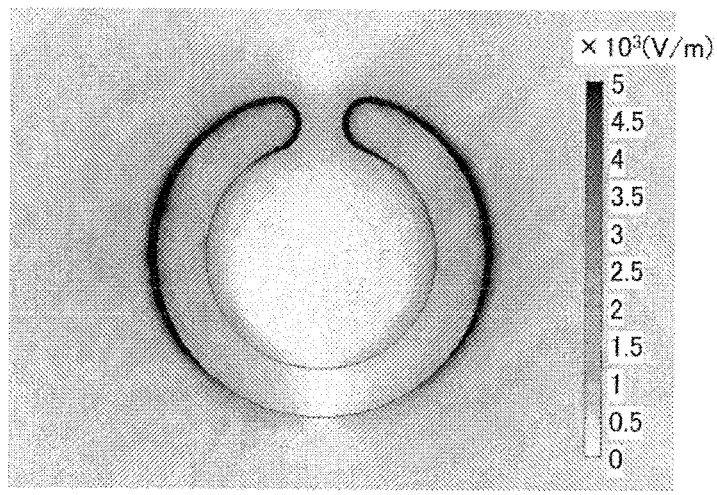
FIG. 10 is a view illustrating an example of a simulation result of an electric field intensity distribution around the conductor pattern illustrated in FIG. 9.

FIG. 10 is a view illustrating an example of a simulation result of an electric field intensity distribution around the conductor pattern illustrated in FIG. 9. As is clear from the simulation result of FIG. 10, the electric field strength around the conductor pattern 19 illustrated in FIG. 9 was $5 \times 10^3$ V/m or more, which satisfied a predetermined allowable specification. That is, even when the entire conductor pattern 19 is formed in a rectangular shape, it has been confirmed that the electric field corresponding to the microwaves is converged around the conductor pattern 19.

Further, in the above exemplary embodiment, a protective film may be formed on the conductor pattern 19 to protect the conductor pattern 19 from plasma. As the protective film, for example, a film made of an yttrium-containing substance is used. The yttrium-containing substance is, for example, $Y_2O_3$.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing container that defines a processing space;
a microwave generator that generates microwaves for plasma excitation;
a dielectric having a facing surface that faces the processing space;
a slot plate provided on a surface of the dielectric opposite to the facing surface and formed with a plurality of slots that radiate the microwaves to the processing space through the dielectric; and
a conductor pattern that is provided in at least one region among a plurality of regions that overlap with the plurality of slots, respectively, when viewed from a direction perpendicular to the facing surface, on the facing surface of the dielectric in order to converge an electric field corresponding to the microwaves radiated from each of the slots.

2. The plasma processing apparatus of claim 1, wherein at least a part of the conductor pattern is formed in a rectangular shape, and when a wavelength of the microwaves propagated inside the dielectric is $\lambda$, a length of the at least a part of the conductor pattern is within a range of $3\lambda/8$ or more and $5\lambda/8$ or less.

3. The plasma processing apparatus of claim 2, wherein the length of the at least a part of the conductor pattern is a length that resonates with the microwaves.

4. The plasma processing apparatus of claim 3, wherein the length of the at least a part of the conductor pattern is $\lambda/2$.

5. The plasma processing apparatus of claim 1, wherein a protective film is formed on the conductor pattern to protect the conductor pattern from plasma.

6. The plasma processing apparatus of claim 1, wherein the conductor pattern is provided in each of the plurality of regions.

7. The plasma processing apparatus of claim 1, wherein the conductor pattern is formed in a cross shape.

8. The plasma processing apparatus of claim 7, wherein the conductor pattern includes:
a first portion formed in a rectangular shape; and
a second portion formed in a rectangular shape and intersecting with the first portion.

9. The plasma processing apparatus of claim 8, wherein a length of the first portion and a length of the second portion are equal.

* * * * *